(12) United States Patent
Gort

(10) Patent No.: US 12,101,092 B2
(45) Date of Patent: Sep. 24, 2024

(54) CHAINED PROGRAMMABLE DELAY ELEMENTS

(71) Applicant: EFINIX, INC., Santa Clara, CA (US)

(72) Inventor: Marcel Gort, Toronto (CA)

(73) Assignee: EFINIX, INC., Santa Clara, CA (US)

( * ) Notice: Subject to any disclaimer, the term of this patent is extended or adjusted under 35 U.S.C. 154(b) by 0 days.

(21) Appl. No.: 18/228,502

(22) Filed: Jul. 31, 2023

(65) Prior Publication Data

US 2023/0378947 A1 Nov. 23, 2023

Related U.S. Application Data

(63) Continuation of application No. 17/584,025, filed on Jan. 25, 2022, now Pat. No. 11,757,439.

(60) Provisional application No. 63/144,880, filed on Feb. 2, 2021.

(51) Int. Cl.
| | |
|---|---|
| *H03K 5/159* | (2006.01) |
| *H03K 5/133* | (2014.01) |
| *H03K 19/17736* | (2020.01) |
| *H03K 5/00* | (2006.01) |

(52) U.S. Cl.
CPC ......... *H03K 5/133* (2013.01); *H03K 19/1774* (2013.01); *H03K 19/17744* (2013.01); *H03K 2005/00019* (2013.01)

(58) Field of Classification Search
CPC ............... H03K 5/133; H03K 19/1774; H03K 19/17744; H03K 2005/00019
See application file for complete search history.

(56) References Cited

U.S. PATENT DOCUMENTS

| | | | | |
|---|---|---|---|---|
| 6,665,230 B1* | 12/2003 | Shrader | ................... | H03K 5/133 365/194 |
| 7,236,033 B2* | 6/2007 | Yeh | .................. | G01R 31/31725 327/261 |
| 7,391,246 B1* | 6/2008 | Lu | ......................... | H03L 7/0805 327/161 |
| 7,456,672 B1* | 11/2008 | Callahan | ................... | G06F 1/10 327/295 |
| 7,515,664 B1* | 4/2009 | Yeoh | ..................... | H04L 7/0083 358/425 |
| 10,075,166 B2* | 9/2018 | Martinez | ................ | H03K 19/20 |
| 2005/0007165 A1* | 1/2005 | Sadowski | ........ | G01R 31/31725 327/141 |
| 2014/0325253 A1* | 10/2014 | Ogata | .................... | H03K 5/133 713/601 |

(Continued)

*Primary Examiner* — Kurtis R Bahr
(74) *Attorney, Agent, or Firm* — Womble Bond Dickinson (US) LLP

(57) ABSTRACT

Delay elements and multiplexers are in programmable delay elements. Each programmable delay element has a chain of delay elements to produce successive delays of a clock of the programmable delay element. Each programmable delay element has a first multiplexer to select among an input clock and delay element outputs in the chain of delay elements to produce a skewed clock output of the programmable delay element. In at least a subset of the programmable delay elements, each programmable delay element has a second multiplexer to select among clocks that include a first clock, and a second clock that is from one of the delay elements of another programmable delay element to produce the clock of the programmable delay element.

20 Claims, 6 Drawing Sheets

(56) References Cited

U.S. PATENT DOCUMENTS

2017/0299651 A1* 10/2017 Clerc .................... H03K 5/133
2019/0044503 A1* 2/2019 Cho ........................ G09G 3/20

* cited by examiner

CHAINED PROGRAMMABLE DELAY ELEMENTS

CROSS-REFERENCE TO RELATED APPLICATIONS

This application is a continuation of and claims the benefit of U.S. patent application Ser. No. 17/584,025 titled CHAINED PROGRAMMABLE DELAY ELEMENTS and filed Jan. 25, 2022, which claims benefit of priority from U.S. Provisional Application No. 63/144,880 titled CHAINED PROGRAMMABLE DELAY ELEMENTS and filed Feb. 2, 2021, both of which is hereby incorporated by reference.

TECHNICAL FIELD

The technical field of the present disclosure relates broadly to electronic circuitry with delay elements and clock signals and more narrowly to field programmable gate arrays (FPGAs) with delay elements and clock signals.

BACKGROUND

Programmable delay elements (PDEs) are commonly used in modern field programmable gate arrays (FPGAs) to delay clock signals by an amount that can be configured. PDEs can be used to satisfy setup and hold constraints without having to shorten or lengthen routes. A PDE can be used to skew a clock forward on the launch clock of a data path, which has the effect of improving hold margin on that data path. Conversely, a PDE can be used to skew a clock forward on the capture clock of a data path, which has the effect of improving setup margin.

For maximum flexibility, in some implementations, each Flip-Flop (FF) has its own PDE with a wide range of programmable delay values. For minimum area, however, the PDEs are amortized so that many FFs share them and they may have only a few carefully chosen programmable delay values. FPGA architects must trade-off clock skewing flexibility for silicon area.

BRIEF SUMMARY

Embodiments of an electronic circuitry apparatus, FPGAs, a method of operating an integrated circuit, a CAD system, a CAD tool, and computer-readable media with instructions are described herein.

One embodiment is an electronic circuitry apparatus. The apparatus has delay elements and multiplexers, in programmable delay elements (PDEs). Each PDE has a subset of the delay elements and a subset of the multiplexers. Each PDE has a chain of delay elements to produce successive delays of a clock of the PDE. Each PDE has a first multiplexer to select among an input clock and delay element outputs in the chain of delay elements to produce a skewed clock output of the PDE. Each PDE of at least a subset of the PDEs has a second multiplexer. The second multiplexer is to select among clocks to produce the clock for the chain of delay elements of the PDE. The clocks for selecting by the second multiplexer include a first clock that is an input clock to each of the PDEs, and a second clock that is from one of the delay elements of another one of the PDEs.

One embodiment is a method of operating an integrated circuit that has multiplexers and delay elements to provide skewed clocks. The method includes producing successive delays of a clock, through a chain of delay elements, in each of multiple programmable delay elements (PDEs). Each PDE has a subset of the multiplexers and delay elements of the integrated circuit. The method includes selecting among at least a first clock and a second clock through a second multiplexer to produce the clock for the chain of delay elements of the PDE, in each of at least a subset of the PDEs. The second clock is from one of the delay elements of another PDE. The method includes selecting among an input clock and delay element outputs in the chain of delay elements through a first multiplexer to produce a skewed clock output of the PDE, in each of the PDEs.

One embodiment is a tangible, non-transitory, computer-readable media. On the media are instructions which, when executed by a processor, cause the processor to perform a method. The method includes programming a field programmable gate array (FPGA) to produce successive delays of a clock, through a chain of delay elements, in each of multiple programmable delay elements (PDEs). Each PDE has a subset of the multiplexers and delay elements of the integrated circuit. The method includes programming the FPGA to select among at least a first clock and a second clock through a second multiplexer to produce the clock for the chain of delay elements of the PDE, in each of at least a subset of the PDEs. The second clock is from one of the delay elements of another PDE. The method includes programming the FPGA to select among an input clock and delay element outputs in the chain of delay elements through a first multiplexer to produce a skewed clock output of the PDE, in each of the PDEs.

BRIEF DESCRIPTION OF DRAWINGS

Embodiments described herein will be understood more fully from the detailed description given below and from the accompanying drawings of various embodiments of the invention, which, however, should not be taken to limit the invention to the specific embodiments, but are for explanation and understanding only.

DETAILED DESCRIPTION

In the following description, numerous details are set forth to provide a more thorough explanation of the present invention. It will be apparent, however, to one skilled in the art, that the present invention may be practiced without these specific details or with variations of the specific details. In other instances, well-known structures and devices are shown in block diagram form, rather than in detail, in order to avoid obscuring the present invention.

The terms "multiplexer" and "mux" are herein used interchangeably, for a circuit that selects from among multiple inputs and drives an output according to the selection. Output drive of a multiplexer or a multiplexer-based circuit could be integrated with the multiplexer or distinct from the multiplexer, in various embodiments. The term "clock" is herein used to apply to a clock signal, a single clock, a clock pair of clock (e.g., commonly named clock, clk, ck, c, etc.) and clock inverse (e.g., commonly named clockn, clkn, cn, nclock, clkbar, etc.), a clock input, a clock output, a clock line or clock signal line in a symbolic representation of an electronic circuit, e.g., a schematic or CAD (computer-aided design) database or a physical implementation of a clock in a physical implementation of an electronic circuit, e.g., an integrated circuit (IC), an FPGA, a printed circuit board, an apparatus, etc., as context dependent.

Among embodiments described herein are a method for chaining Programmable Delay Elements (PDEs) to generate multiple skewed clocks that can share the cost of having many discrete skew values and a high maximum skew, and an apparatus having chained PDEs to generate multiple skewed clocks.

Embodiments described herein include a novel chaining mechanism for PDEs so that a higher number of delay values can be supported and also a higher maximum delay value can be achieved. In one embodiment, each PDE can support M discrete delay values. In such case(s), a chain of N PDEs can support up to M*N delay values and can drive up to N different clock lines. These clock lines share the chained PDEs so that the area cost of chaining N PDEs together is amortized.

Different chaining strategies result in different clock flexibility. In one embodiment, a simple unidirectional chain (see FIG. 1) allows one clock to have the maximum benefit from chaining flexibility, while one clock has no chaining ability. A bidirectional chain (see FIG. 2) allows more chaining flexibility. A circular chain means each generated clock has the same amount of chaining flexibility. The circular chain (see FIG. 3) can be unidirectional or bidirectional. A hierarchical chain (see FIG. 5) can also be used to get higher maximum skew values.

Additionally, in one embodiment, M and N are modifiable. In one such case, M and N are modified to get different numbers of skewed clocks and different numbers of discrete delay values.

Figure 1:
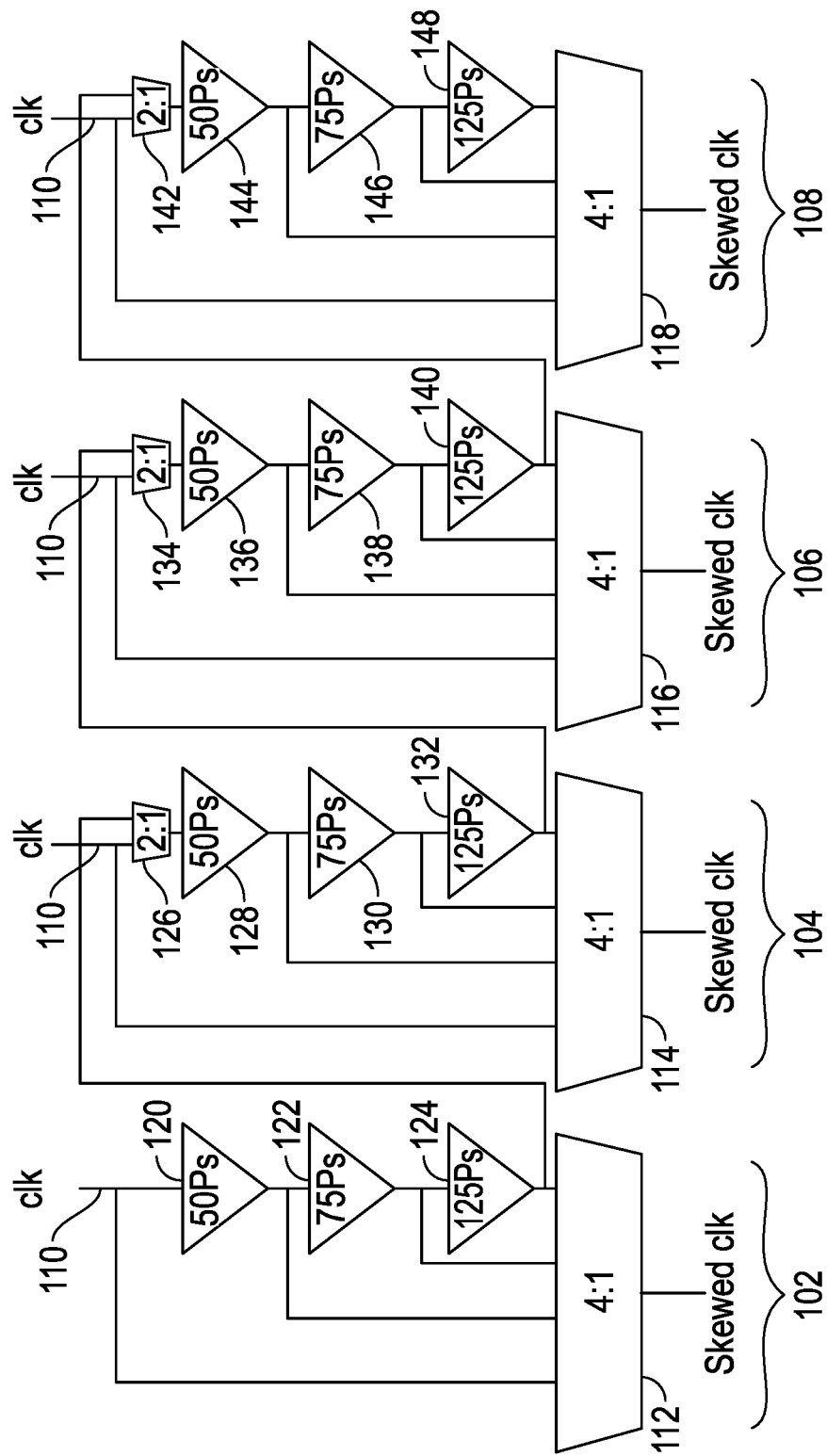
FIG. 1 illustrates an implementation with chaining of four PDEs to provide four skewed clocks with a unidirectional chain.

FIG. 1 illustrates one embodiment with four PDEs 102, 104, 106, 108 chained together with a unidirectional chain. Each PDE has multiple delay elements and a multiplexer that selects among an input clock and various clock delays produced by the delay element outputs, to produce a skewed clock as an output of that PDE. Referring to FIG. 1, the skewed clock on the left in the diagram, as an output of the PDE 102 produced by the left-most multiplexer 112 (e.g., a 4:1 mux), can have delay values of 0 ps, 50 ps, 125 ps, 250 ps relative to the input clock 110 labeled clk. These successive delay values are produced by the delay elements 120, 122, 124 in a chain of successive delay elements of the PDE 102. That is, the multiplexer 112 can select from among the input clock 110 at zero delay, a first clock delay produced by a first delay element 120, a second clock delay produced by a second delay element 122, and a third clock delay produced by a third delay element 124. The 250 ps output produced by the last delay element 124 in the chain of delay elements 120, 122, 124 drives the 2:1 mux 126 in the next, successive PDE 104 depicted to the right in the figure thereby giving the second skewed clock, as an output of the PDE 104 from the multiplexer 114 of that PDE 104, more possible delay values (0, 50, 125, 250, 300, 375, 500 ps).

The clock furthest to the right, i.e., the fourth skewed clock as an output of the PDE 108 from the multiplexer 118 of that PDE 108, can be skewed up to 1000 ps. Such a maximum possible delay value for a skewed clock in a unidirectional chain of delay elements is selected when each output multiplexer 112, 114, 116, 118 in all of the PDEs 102, 104, 106, 108 selects the maximum clock delay for that PDE 102, 104, 106, 108, and each input multiplexer 126, 134, 142 in PDEs 104, 106, 108 that have input multiplexers selects the maximum clock delay from the preceding PDE. In the embodiment in FIG. 1, the input multiplexers 126, 134, 142 are all 2:1 muxes, each receiving as input the input clock 110 and a maximum clock delay from a preceding PDE, e.g., output of delay element 124 from the first PDE 102 as input to the second PDE 104, output of delay element 132 from the second PDE 104 as input to the third PDE 106, and output of delay element 140 from the third PDE 106 as input to the fourth PDE 108.

Further embodiments of PDEs generalize to various sizes of output multiplexers, various sizes of input multiplexers, various numbers of delay elements in a delay chain, various numbers of PDEs connected together within a programmable clock circuit, various connections of various delay elements of various PDEs to input multiplexers of other PDEs and to output multiplexers in a PDE, and tuning for various delay values. Various delay elements in various circuits and technologies are possible (see FIG. 4, for some examples). Further embodiments of PDEs generalize to various directions and selectability of chaining delay elements (see FIGS. 2 and 3, and consideration of variations thereof as applicable to FIG. 1).

Figure 2:
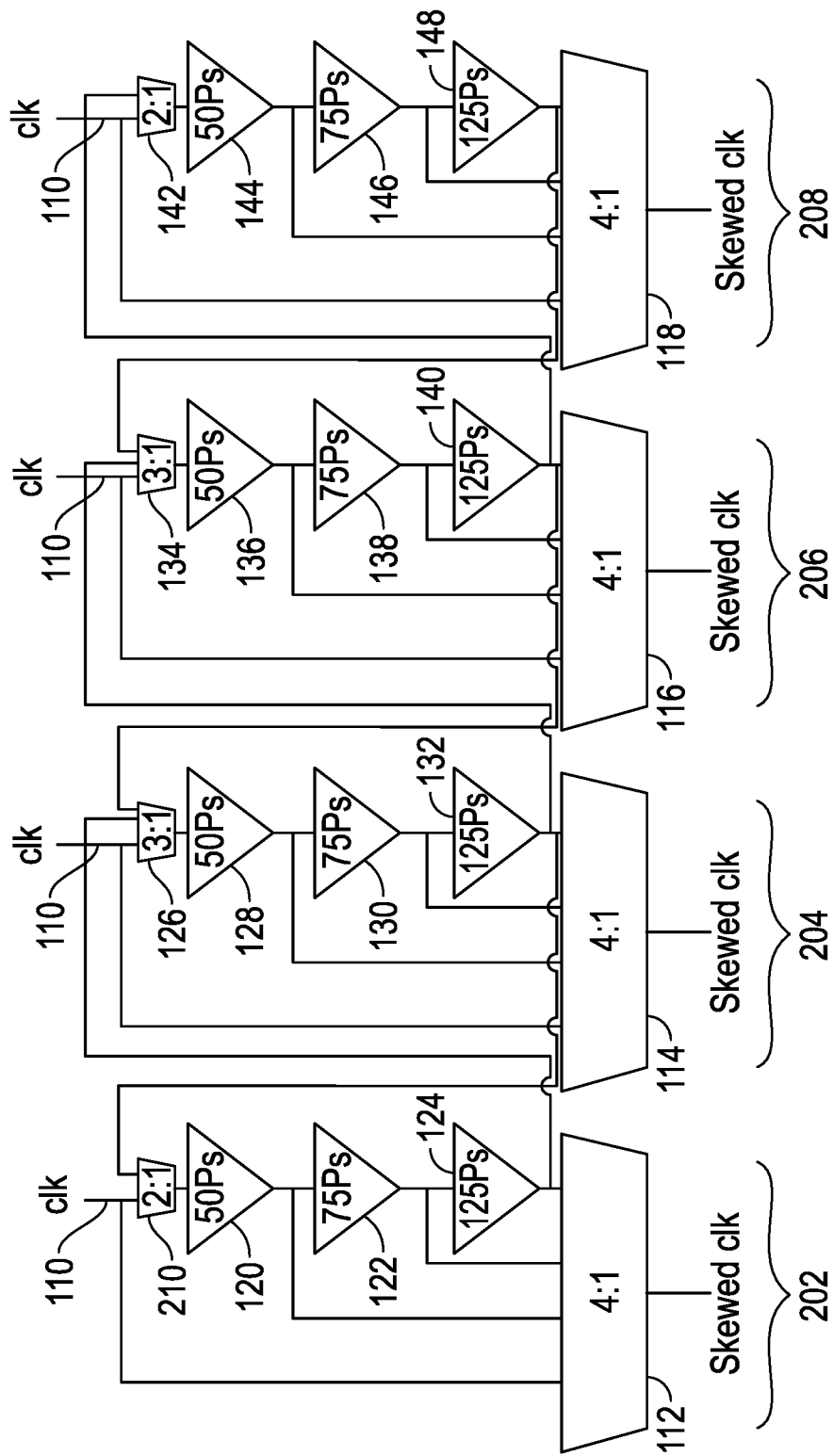
FIG. 2 illustrates an implementation with chaining of four PDEs to provide four skewed clocks with a bidirectional chain.

FIG. 2 illustrates another embodiment with four PDEs 202, 204, 206, 208 chained together using bidirectional chains. This offers more flexibility than having a unidirectional chain because the PDE 102 furthest to the left in the unidirectional chain embodiment does not have an input clock multiplexer and is limited to skewing by 250 ps, by adding successive delays to the input clock 110 (see FIG. 1). In contrast, in the bidirectional chain embodiment in FIG. 2, the middle two PDEs 204, 206 can skew up to 750 ps while the PDEs 202, 208 on the left and right can skew up to 1000 ps. Selecting one direction for chaining delay elements, the maximum possible delay value for a skewed clock is selected for skewed clock output of the right-most PDE 208 when each output multiplexer 112, 114, 116, 118 in all of the PDEs 202, 204, 206, 208 selects the maximum clock delay for that PDE 202, 204, 206, 208, and each input multiplexer 126, 134, 142 in PDEs 204, 206, 208 selects the maximum clock delay from the PDE to the left. Selecting the opposite direction for chaining delay elements, the maximum possible delay value for a skewed clock is selected for skewed clock output of the left most PDE 202 when each output multiplexer 112, 114, 116, 118 in all of the PDEs 202, 204, 206, 208 selects the maximum clock delay for that PDE 202, 204, 206, 208, and each input multiplexer 210, 126, 126, 142 in PDEs 202, 204, 206, 208 selects the maximum clock delay from the PDE to the right. There are thus two opposed directions for chaining delay elements, making this embodiment bidirectional.

In the embodiment in FIG. 2, the input multiplexers 210, 142 in the left-most and right-most PDEs 202, 208 are each 2:1 muxes, each receiving as input the input clock 110 and a maximum clock delay from an adjacent PDE, e.g., output of delay element 132 from the second PDE 204 as input to the first PDE 202, and output of delay element 140 from the third PDE 206 as input to the fourth PDE 208. The input multiplexers 210, 142 in the middle two PDEs 204, 206 are each 3:1 muxes, each receiving as input the input clock 110 and a maximum clock delay from each of the two adjacent PDEs in both directions, e.g., output of delay element 124 from the first PDE 202 and output of delay element 140 from the third PDE 206 as inputs to the second PDE 102, and output of delay element 132 from the second PDE 102 and output of delay element 148 from the fourth PDE 208 as inputs to the third PDE 106.

Figure 3:
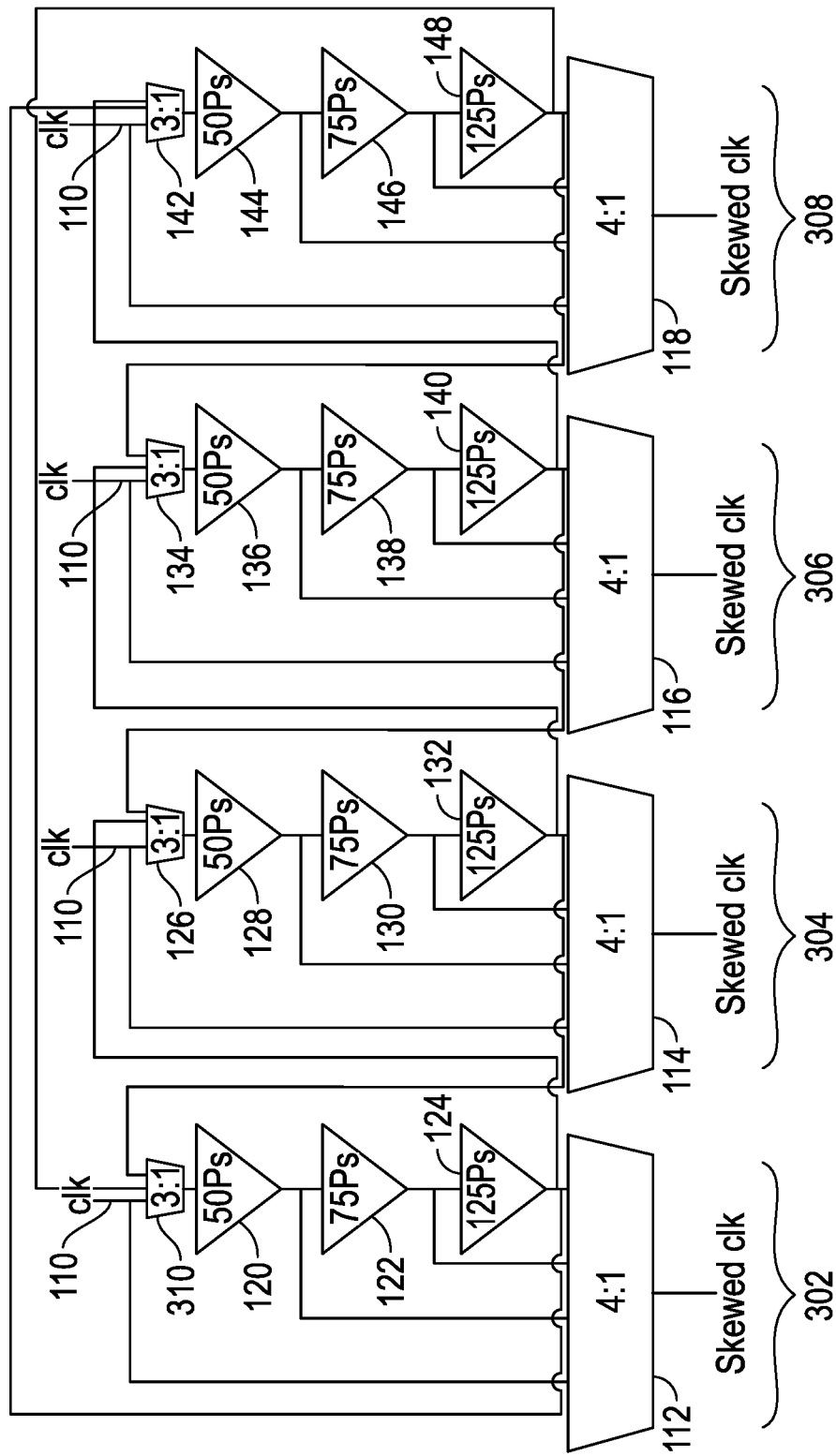
FIG. 3 illustrates an implementation with chaining of four PDEs to provide four skewed clocks with a circular bidirectional chain.

FIG. 3 illustrates yet another embodiment of four PDEs 302, 304, 306, 308 chained together. The embodiment of the chain structure in FIG. 3 has more flexibility than the chain structure shown in FIG. 2. In one embodiment, this is achieved by creating links between the left-most and right-most PDEs, which results in a circular structure. Such circular structure can be implemented in a bidirectional embodiment, as illustrated in FIG. 3, or unidirectional embodiments using aspects of the embodiment illustrated in FIG. 1.

In the bidirectional circular embodiment illustrated in FIG. 3, each input multiplexer 310,126,134,142 in a PDE 302,304,306,308 is a 3:1 mux that selects from among an input clock 110 and maximum delays from chains of delay elements in left and right adjacent PDEs (allowing for wraparound adjacency of end or left and right-most PDEs in a circular circuit connection architecture). The input multiplexer 310, 126, 134, 142 in a given PDE 302, 304, 306, 308 produces a selected clock of that PDE, and the chain of delay elements in that PDE produces successive delays of that clock. Similar to other embodiments, an output multiplexer 112, 114, 116, 118 selects from among an input clock of the PDE and the delays and delay element outputs in the chain, to produce the skewed clock output of the PDE 302, 304, 306, 308.

In one unidirectional circular embodiment, input multiplexers in the PDEs are each 2:1 muxes that select from among an input clock 110 and the maximum delay from the chain of delay elements in the adjacent PDE to the left, again allowing for wraparound adjacency so that in this case the left-most PDE receives as input a maximum delay from the right-most PDE.

In another unidirectional circular embodiment, input multiplexers in the PDEs are each 2:1 muxes that select from among an input clock 110 and the maximum delay from the chain of delay elements in the adjacent PDE to the right, again allowing for wraparound adjacency so that in this case the right-most PDE receives as input a maximum delay from the left-most PDE.

FIG. 4 (composed of FIGS. 4A-4F) illustrates example delay elements that can be used in various embodiments of PDEs. These and further example delay elements could be implemented in transistor circuits in various transistor and integrated circuit technologies. These and further delay elements may be in standard use in clock generation and clock buffering in known circuits, and are herein applied as delay elements in embodiments of PDEs as illustrated in FIGS. 1-3 and variations thereof.

Figure 4A:
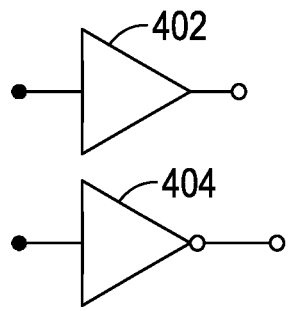
FIG. 4, composed of FIGS. 4A-4F, illustrates example delay elements that can be used in various embodiments of PDEs.

FIG. 4A illustrates a noninverting buffer 402, and an inverting buffer or inverter 404. These and other circuits can be tuned for buffer delay using transistor sizes, intrinsic or extrinsic impedance, voltage controlled delay and other timing control and circuit design techniques.

Figure 4B:
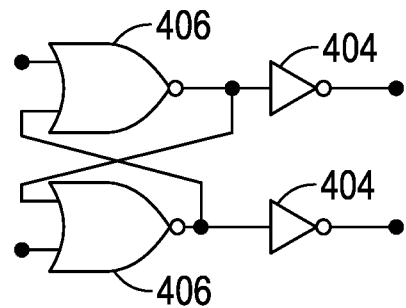

FIG. 4B illustrates a nonoverlapping clock and inverse clock generator, made of cross coupled NOR gates 406 followed by inverting buffers or inverters 404. Noninverting buffers could also be used.

Figure 4C:
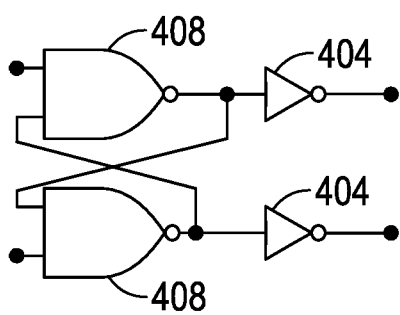

FIG. 4C illustrates a nonoverlapping clock and inverse clock generator, made of cross coupled NAND gates 408 followed by inverting buffers or inverters 404. Noninverting buffers could also be used.

Figure 4D:
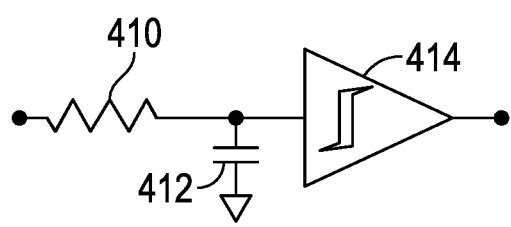

FIG. 4D illustrates an RC delay circuit, made of a resistor 410 and capacitor 412 in series, connected at the junction between the resistor 410 and capacitor 412, to a Schmitt trigger 414, which is an amplifier with hysteresis. Schmitt triggers, inverting or noninverting, are readily devised in electronic circuits.

Figure 4E:
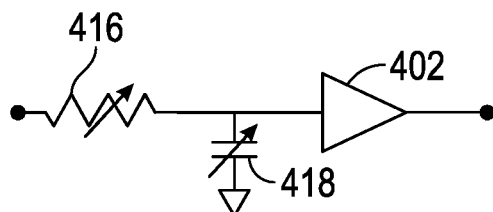

FIG. 4E illustrates another RC delay circuit, made of a variable resistor 416 and a variable capacitor 418 in series, connected at the junction between the resistor 416 and the capacitor 418 to an amplifier or noninverting buffer 402. In variations, an inverter 404, Schmitt trigger 414 or other amplifier could be used. A variable resistor 416 and fixed capacitor, or fixed resistor and variable capacitor, could be used. The variable resistor 416 and/or the variable capacitor 418 could be laser trimmed circuit components, or made variable through active circuitry under voltage control, switching or other technique.

Figure 4F:
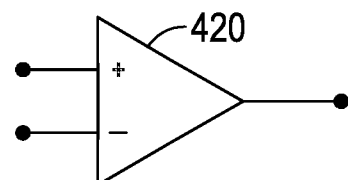

FIG. 4F illustrates an operational amplifier that could be pressed into service as either a buffer or noninverting buffer, with appropriate connections and supporting circuitry as readily devised. Delay control circuitry for an operational amplifier is readily devised, for tuned or controlled versions.

Figure 5:
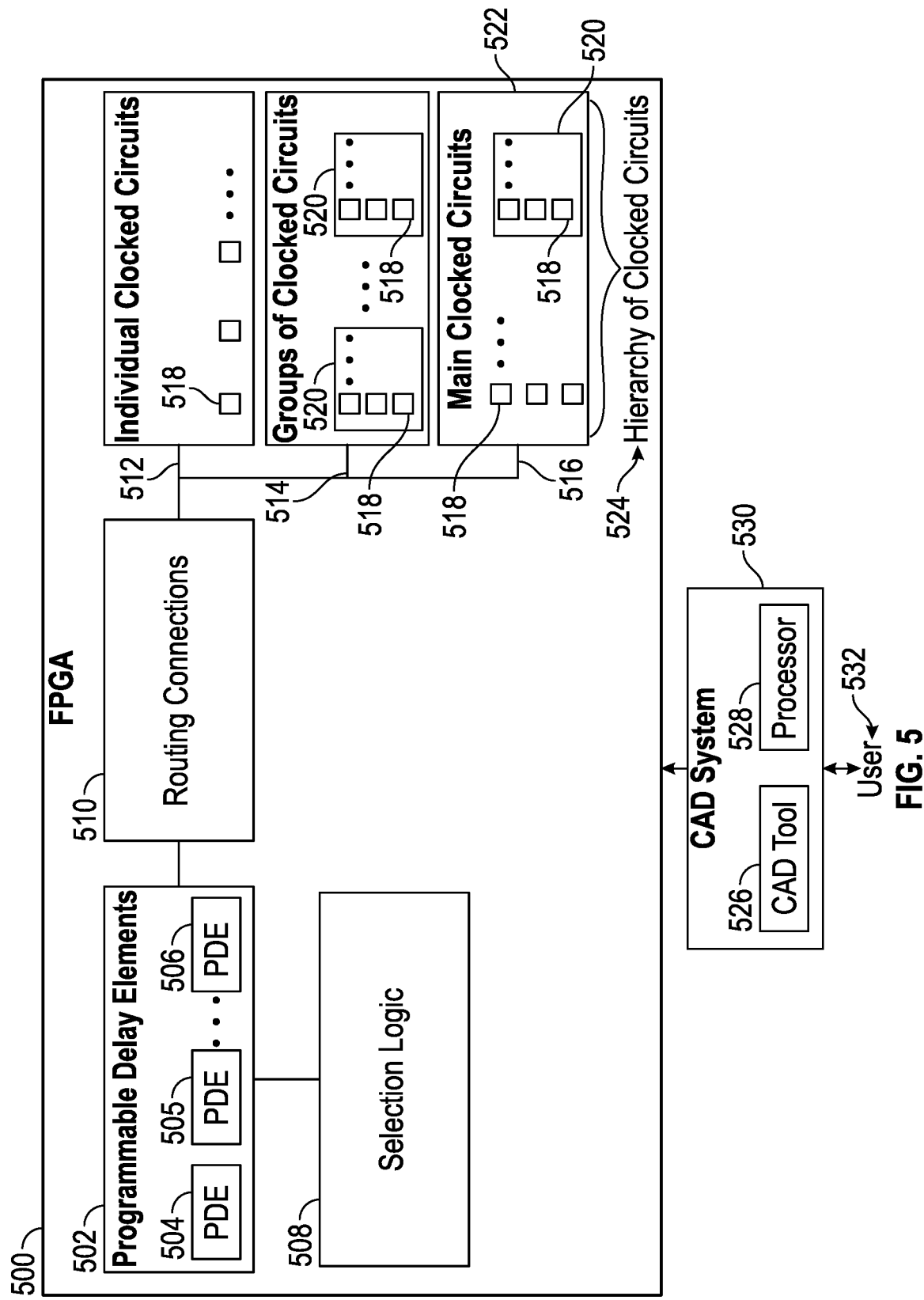
FIG. 5 illustrates a hierarchical chain of delay elements that provides skewed clocks to a hierarchy of clocked circuits, in an embodiment of PDEs in an FPGA that is programmed through a CAD system using a CAD tool.

FIG. 5 illustrates a hierarchical chain of delay elements that provides skewed clocks to a hierarchy 524 of clocked circuits, in an embodiment of PDEs 502 in an FPGA 500 that is programmed through a CAD system 530 using a CAD tool 526. In an operating scenario, the user 532 interacts with the CAD system 530, which has a CAD tool 526 that is executed by a processor 528. The user 532 directs the CAD system 530 to program the FPGA 500, for example according to a CAD database supplied or developed by the user through the CAD tool 526. In the embodiment illustrated in FIG. 5, the FPGA 500 is programmed to produce successive delays of clocks and produce clocks for various clocked circuits, for example as described herein with the programmable delay elements.

Continuing in FIG. 5, the FPGA prior to programming has programmable delay elements 504, 505, 506 available, e.g., as hard circuitry in the unprogrammed FPGA. Alternatively, in a further embodiment, programming the FPGA configures various circuits into forming the PDEs. In both cases, the programmed FPGA 500 has various clocked circuits, according to the design supplied or developed by the user. In this embodiment, the clocked circuits are in a hierarchy 524 of clocked circuits. For example there are individual clocked circuits 518, each of which has a clock. There are groups 520 of clocked circuits 518, and each group 520 has a specified clock. And, there are main clocked circuits 522 all operating with a specified main clock, e.g., a global or system clock, possibly also termed a spine clock, or possibly multiple main clocks (e.g., a high-speed clock, a low-speed clock, a logic clock, an RF clock, a phase locked loop clock, etc.) Part of the action of programming the FPGA 500 is for the CAD tool 526 to specify the routing connections 510 that route the various selectable delayed clocks from the PDEs 504, 505, 506 to the hierarchy 524 of clocked circuits. Another part of the action of programming the FPGA 500 is for the CAD tool 526 to specify selection logic 508 that, in the programmed FPGA 500, selects the various selectable delayed clocks from the PDEs 504, 505, 506 for the routing connections 510 to the hierarchy 524 of clocked circuits. It should be appreciated that there would need to be a sufficient number of PDEs in the group or collection of programmable delay elements 502, to meet the needs of how many different delayed clocks are supplied to the hierarchy 524 of clocked circuits, including one or more individual clocks 512 each to one or multiple ones of the individual clocked circuits 518, one or more group clocks 514 each to one or multiple ones of the groups 520 of clocked circuits, and one or more main clocks each to the main clocked circuits 522. In a further level of hierarchy, there could be families of clocks.

Figure 6:
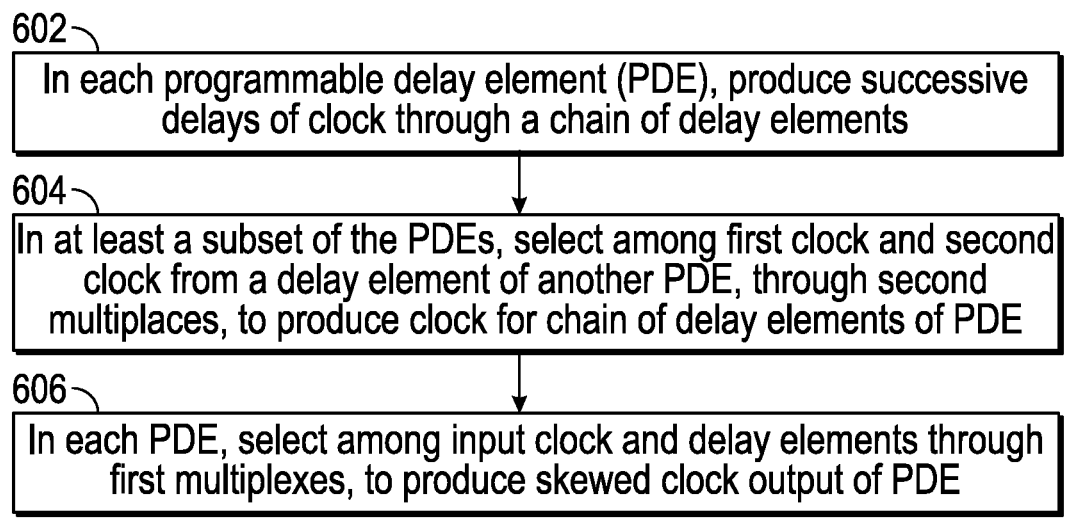
FIG. 6 is a flow diagram of a method of operation of an electronic circuitry apparatus, which can use or be practiced by embodiments described herein.

FIG. 6 is a flow diagram of a method of operation of an electronic circuitry apparatus, which can use or be practiced by embodiments described herein.

In an action 602, in each programmable delay element (PDE) produce successive delays of a clock through a chain of delay elements. For example, in an electronic circuit that has multiple PDEs, each PDE has a chain of delay elements of the PDE, and these delay elements produce the successive delays of the clock of the PDE.

In an action 604, in at least a subset of the PDEs, select among a first clock (e.g., an input clock to the PDE) and a second clock from a delay element of another PDE, through a second multiplexer, to produce a clock for the chain of delay elements of the PDE. For example, in an electronic circuit that has multiple PDEs, a subset of the PDEs each have a second multiplexer of the PDE. The second multiplexer selects among a first clock and a second clock, to produce a clock for the PDE. The second clock is from another PDE. The so-produced clock is applied to the chain of delay elements in the PDE, in the action 602.

In an action 606, in each PDE, select among an input clock and delay elements in the chain of delay elements through a first multiplexer, to produce the skewed clock output of the PDE. For example, in an electronic circuit that has multiple PDEs, each PDE has a first multiplexer of the PDE. The first multiplexer selects among the first clock and the successive delays and delay elements, to produce the skewed clock output.

With the chaining of delayed clocks from one PDE to another in various embodiments, a group of PDEs can produce a variety of skewed clock outputs with a large selection of delays that is greater than would be available from a single PDE or group of PDEs without clock chaining, using the above method.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

I claim:

1. An electronic circuitry apparatus comprising:
a plurality of delay elements;
a plurality of multiplexers;
the plurality of delay elements and the plurality of multiplexers in a plurality of programmable delay elements (PDEs) comprising a first PDE and a second PDE with each PDE having a subset of the plurality of delay elements and a subset of the plurality of multiplexers, the first PDE having a first chain of delay elements comprising a first delay element and a second delay element to produce successive delays of a first clock of the first PDE and a first multiplexer to select among the first clock that is an input clock of the first PDE and delay element outputs in the first chain of delay elements to produce a skewed first clock output of the first PDE; and each PDE of at least a subset of the plurality of PDEs comprising the second PDE having a second chain of delay elements comprising a third delay element and a fourth delay element and a second multiplexer to select among a plurality of clocks comprising a third clock that is the input clock of the second PDE and a fourth clock that is from the second delay element of the first PDE to produce a second clock for the second chain of delay elements of the second PDE.

2. The electronic circuitry apparatus of claim 1, wherein:
each of the plurality of PDEs comprises three delay elements in the chain of delay elements, and a four input multiplexer as the first multiplexer to produce the skewed clock output of the PDE through selection among the first clock and output of each of the three delay elements; and
the plurality of PDEs is in a field programmable gate array (FPGA).

3. The electronic circuitry apparatus of claim 1, wherein:
the plurality of PDEs comprises the first PDE having a first chain of delay elements to produce successive delays of the first clock, and the first multiplexer of the first PDE to produce the skewed clock output of the first PDE through selection among the first clock and output of each delay element of the first chain of delay elements; and
each successive PDE of the plurality of PDEs in succession after the first PDE having a chain of delay elements, the second multiplexer of the successive PDE to produce the clock of the successive PDE through selection among the first clock and a maximum delay clock at an end of the chain of delay elements of a preceding PDE, and the first multiplexer of the successive PDE to produce the skewed clock output of the successive PDE through selection among the first clock and output of each delay element of the chain of delay elements of the successive PDE, so that the plurality of PDEs comprises a unidirectional chain of delay elements.

4. The electronic circuitry apparatus of claim 1, wherein:
the plurality of PDEs comprises the first PDE, a plurality of middle PDEs and a last PDE, the first PDE having the first chain of delay elements, the second multiplexer of the first PDE to produce the first clock of the first PDE through selection among the input clock of the first PDE and a maximum delay at an end of the chain of delay elements of a lower one of the plurality of middle PDEs, and the first multiplexer of the first PDE to produce the skewed first clock output of the first PDE through selection among the first clock and output of each delay element of the first chain of delay elements of the first PDE;

each PDE of the plurality of middle PDEs having a chain of delay elements, the second multiplexer of the middle PDE to produce the clock of the middle PDE through selection among the first clock, a maximum delay clock at an end of the chain of delay elements of a preceding PDE, and a maximum delay clock at an end of the chain of delay elements of a succeeding PDE, and the first multiplexer of the middle PDE to produce the skewed clock output of the middle PDE through selection among the first clock and output of each delay element of the chain of delay elements of the middle PDE; and the last PDE having a chain of delay elements, the second multiplexer of the last PDE to produce the clock of the last PDE through selection among the first clock and a maximum delay at an end of the chain of delay elements of an upper one of the plurality of middle PDEs, and the first multiplexer to produce the skewed clock output of the last PDE through selection among the first clock and output of each delay element of the chain of delay elements of the last PDE, so that the plurality of PDEs comprises a bidirectional chain of delay elements.

5. The electronic circuitry apparatus of claim 1, wherein:
each of the plurality of PDEs having a chain of delay elements, the second multiplexer of the PDE to produce the clock of the PDE through selection among the first clock and a maximum delay clock at an end of the chain of delay elements of a preceding PDE, and the first multiplexer of the PDE to produce the skewed clock output of the PDE through selection among the first clock and output of each delay element of the chain of delay elements of the PDE so that the plurality of PDEs comprises a unidirectional circular chain of delay elements.

6. The electronic circuitry apparatus of claim 1, wherein:
each of the plurality of PDEs having a chain of delay elements, the second multiplexer of the PDE to produce the clock of the PDE through selection among the first clock, a maximum delay clock at an end of the chain of delay elements of a first other PDE and a maximum delay clock at an end of the chain of delay elements of a second other PDE, and the first multiplexer of the PDE to produce the skewed clock output of the PDE through selection among the first clock and output of each delay element of the chain of delay elements of the PDE so that the plurality of PDEs comprises a bidirectional circular chain of delay elements.

7. The electronic circuitry apparatus of claim 1, further comprising:
selection logic to control the plurality of multiplexers to select a plurality of delays according to the delay elements and the skewed clock outputs of the PDEs for routing one or more individual clocks to individual clocked circuits, one or more group clocks to groups of clocked circuits, and one or more main clocks to a plurality of clocked circuits, so that the plurality of PDEs comprises a hierarchical chain of delay elements that provides skewed clocks to clocked circuits in a hierarchy.

8. A method of operating an integrated circuit having multiplexers and delay elements to provide skewed clocks, the method comprising:
producing successive delays of a clock, through a chain of delay elements, in each of a plurality of programmable delay elements (PDEs) having a subset of the multiplexers and delay elements of the integrated circuit, the plurality of PDEs comprising a first PDE and a second PDE, the first PDE having a first chain of delay elements comprising a first delay element and a second delay element to produce successive delays of a first clock of the first PDE and a first multiplexer and the second PDE having a second chain of delay elements comprising a third delay element and a fourth delay element and a second multiplexer;

selecting, through the second multiplexer, in each PDE of at least a subset of the plurality of PDEs comprising the second PDE, among at least a third clock that is an input clock of the second PDE and a fourth clock that is from the second delay element of the first PDE to produce a second clock for the second chain of delay elements of the second PDE; and selecting, through the first multiplexer, among the first clock that is an input clock of the first PDE and delay element outputs in the first chain of delay elements to produce a skewed first clock output of the first PDE, in each of the plurality of PDEs.

9. The method of claim 8, wherein:

producing the successive delays through the chain of delay elements comprises producing the successive delays through three delay elements; and selecting through the first multiplexer comprises selecting, through a four-input multiplexer, among the first clock and output of each of the three delay elements to produce the skewed clock output of the PDE.

10. The method of claim 8, wherein:

selecting through the first multiplexer, in the first PDE of the plurality of PDEs, comprises selecting among the first clock and output of each delay element of the first chain of delay elements to produce the skewed first clock output of the first PDE;

producing the successive delays of the first clock, in the first PDE, comprises producing the successive delays of the first clock through the first chain of delay elements;

selecting through the second multiplexer, in each successive PDE of the plurality of PDEs in succession after the first PDE, comprises selecting among the third clock and the fourth clock that is a maximum delay clock at an end of the chain of the delay elements of a preceding PDE to produce the clock of the successive PDE; and selecting through the first multiplexer, in each successive PDE of the plurality of PDEs in succession after the first PDE, comprises selecting among the first clock and output of each delay element of the chain of delay elements in the successive PDE to produce the skewed clock output of the successive PDE, so that the plurality of PDEs comprises a unidirectional chain of delay elements.

11. The method of claim 8, wherein:

selecting through the second multiplexer, in the first PDE of the plurality of PDEs, comprises selecting among the first clock and a maximum delay at an end of the chain of delay elements of a lower one of the plurality of middle PDEs to produce the clock of the first PDE;

selecting through the first multiplexer, in the first PDE, comprises selecting among the first clock and output of each delay element of the chain of delay elements in the first PDE to produce the skewed clock output of the first PDE;

selecting through the second multiplexer, in each PDE of a plurality of middle PDEs, comprises selecting among the first clock, a maximum delay clock at an end of the chain of delay elements of a preceding PDE, and a maximum delay clock at an end of the chain of delay elements of a succeeding PDE to produce the clock of the PDE;

selecting through the first multiplexer, in each PDE of the plurality of middle PDEs, comprises selecting among the first clock and output of each delay element of the chain of delay elements in the PDE to produce the skewed clock output of the PDE;

selecting through the second multiplexer, in a last PDE of the plurality of PDEs, comprises selecting among the first clock and a maximum delay at an end of the chain of delay elements of an upper one of the plurality of middle PDEs to produce the clock of the last PDE; and selecting through the first multiplexer, in the last PDE, comprises selecting among the first clock and output of each delay element of the chain of delay elements in the last PDE to produce the skewed clock output of the last PDE, so that the plurality of PDEs comprises a bidirectional chain of delay elements.

12. The method of claim 8, wherein:

selecting through the second multiplexer, in each of the plurality of PDEs, comprises selecting among the first clock and a maximum delay clock at an end of the chain of delay elements of a preceding PDE to produce the clock of the PDE; and selecting through the first multiplexer, in each of the plurality of PDEs, comprises selecting among the first clock and output of each delay element of the chain of delay elements in the PDE to produce the skewed clock output of the PDE, so that the plurality of PDEs comprises a unidirectional circular chain of delay elements.

13. The method of claim 8, wherein:

selecting through the second multiplexer, in each of the plurality of PDEs, comprises selecting among the first clock, a maximum delay clock at an end of the chain of delay elements of a first other PDE and a maximum delay clock at an end of the chain of delay elements of a second other PDE to produce the clock of the PDE; and selecting through the first multiplexer, in each of the plurality of PDEs, comprises selecting among the first clock and output of each delay element of the chain of delay elements to produce the skewed clock output of the PDE, so that the plurality of PDEs comprises a bidirectional circular chain of delay elements.

14. The method of claim 8, further comprising:

operating the PDEs through selection logic to select a plurality of delays according to the delay elements and the skewed clock outputs of the PDEs for routing one or more individual clocks to individual clocked circuits, one or more group clocks to groups of clocked circuits, and one or more main clocks to a plurality of clocked circuits, so that the plurality of PDEs comprises a hierarchical chain of delay elements that provides skewed clocks to clocked circuits in a hierarchy.

15. A tangible, non-transitory, computer-readable media having instructions thereupon which, when executed by a processor, cause the processor to perform a method comprising:

programming a field programmable gate array (FPGA), to:

produce successive delays of a clock, through a chain of delay elements, in each of a plurality of programmable delay elements (PDEs) having a subset of multiplexers and delay elements of the FPGA, the plurality of PDEs comprising a first PDE and a second PDE, the first PDE having a first chain of delay elements comprising a first delay element and a second delay element to produce successive delays of a first clock of the first PDE and a first multiplexer and the second PDE having a second chain of delay elements comprising a third delay element and a fourth delay element and a second multiplexer;

select, through the second multiplexer, in each PDE of at least a subset of the plurality of PDEs comprising the second PDE, among at least a third clock that is an input clock of the second PDE and a fourth clock that is from the second delay element of the first PDE to produce a second clock for the second chain of delay elements of the second PDE; and select, through the first multiplexer, among the first clock that is an input clock of the first PDE and delay element outputs in the first chain of delay elements to produce a skewed first clock output of the first PDE, in each of the plurality of PDEs.

16. The computer-readable media of claim 15, wherein programming the FPGA comprises: selecting through the first multiplexer, in the first PDE of the plurality of PDEs, comprises selecting among the first clock and output of each delay element of the first chain of delay elements to produce the skewed first clock output of the first PDE;

producing the successive delays of the first clock, in the first PDE, comprises producing the successive delays of the first clock through the first chain of delay elements;

selecting through the second multiplexer, in each successive PDE of the plurality of PDEs in succession after the first PDE, comprises selecting among the third clock and the fourth clock that is a maximum delay clock at an end of the chain of the delay elements of a preceding PDE to produce the clock of the successive PDE; and selecting through the first multiplexer, in each successive PDE of the plurality of PDEs in succession after the first PDE, comprises selecting among the first clock and output of each delay element of the chain of delay elements in the successive PDE to produce the skewed clock output of the successive PDE, so that the plurality of PDEs comprises a unidirectional chain of delay elements.

17. The computer-readable media of claim 15, wherein programming the FPGA comprises: selecting through the second multiplexer, in the first PDE of the plurality of PDEs, comprises selecting among the first clock and a maximum delay at an end of the chain of delay elements of a lower one of the plurality of middle PDEs to produce the clock of the first PDE;

selecting through the first multiplexer, in the first PDE, comprises selecting among the first clock and output of each delay element of the chain of delay elements in the first PDE to produce the skewed clock output of the first PDE;

selecting through the second multiplexer, in each PDE of a plurality of middle PDEs, comprises selecting among the first clock, a maximum delay clock at an end of the chain of delay elements of a preceding PDE, and a maximum delay clock at an end of the chain of delay elements of a succeeding PDE to produce the clock of the PDE;

selecting through the first multiplexer, in each PDE of the plurality of middle PDEs, comprises selecting among the first clock and output of each delay element of the chain of delay elements in the PDE to produce the skewed clock output of the PDE;

selecting through the second multiplexer, in a last PDE of the plurality of PDEs, comprises selecting among the first clock and a maximum delay at an end of the chain of delay elements of an upper one of the plurality of middle PDEs to produce the clock of the last PDE; and selecting through the first multiplexer, in the last PDE, comprises selecting among the first clock and output of each delay element of the chain of delay elements in the last PDE to produce the skewed clock output of the last PDE, so that the plurality of PDEs comprises a bidirectional chain of delay elements.

18. The computer-readable media of claim 15, wherein programming the FPGA comprises: selecting through the second multiplexer, in each of the plurality of PDEs, comprises selecting among the first clock and a maximum delay clock at an end of the chain of delay elements of a preceding PDE to produce the clock of the PDE; and the selecting through the first multiplexer, in each of the plurality of PDEs, comprises selecting among the first clock and output of each delay element of the chain of delay elements in the PDE to produce the skewed clock output of the PDE, so that the plurality of PDEs comprises a unidirectional circular chain of delay elements.

19. The computer-readable media of claim 15, wherein programming the FPGA comprises: selecting through the second multiplexer, in each of the plurality of PDEs, comprises selecting among the first clock, a maximum delay clock at an end of the chain of delay elements of a first other PDE and a maximum delay clock at an end of the chain of delay elements of a second other PDE to produce the clock of the PDE; and selecting through the first multiplexer, in each of the plurality of PDEs, comprises selecting among the first clock and output of each delay element of the chain of delay elements to produce the skewed clock output of the PDE, so that the plurality of PDEs comprises a bidirectional circular chain of delay elements.

20. The computer-readable media of claim 15, wherein the instructions further cause the processor to further program the FPGA to:

control the PDEs through selection logic to select a plurality of delays according to the delay elements and the skewed clock outputs of the PDEs for routing one or more individual clocks to individual clocked circuits, one or more PDE clocks to PDEs of clocked circuits, and one or more main clocks to a plurality of clocked circuits, so that the plurality of PDEs comprises a hierarchical chain of delay elements that provides skewed clocks to clocked circuits in a hierarchy.

* * * * *